United States Patent [19]

Madden et al.

[11] Patent Number: 4,910,713
[45] Date of Patent: Mar. 20, 1990

[54] HIGH INPUT IMPEDANCE, STROBED CMOS DIFFERENTIAL SENSE AMPLIFIER

[75] Inventors: William C. Madden, Lexington; William J. Bowhill, Marlborough, both of Mass.

[73] Assignee: Digital Euipment Corporation, Hudson, Mass.

[21] Appl. No.: 212,346

[22] Filed: Jun. 27, 1988

[51] Int. Cl.⁴ .................. G11C 7/00; G11C 11/40
[52] U.S. Cl. .................. 365/189.11; 365/193; 365/205; 365/207; 365/190; 307/530
[58] Field of Search ............... 307/530; 365/193, 233, 365/205, 206, 207, 189.11, 190

[56] References Cited

U.S. PATENT DOCUMENTS 3,967,252 6/1976 Donnelly .................. 365/189.11
4,133,049 1/1979 Shirato .................. 365/207 X
4,551,641 11/1985 Pelley, III .................. 365/205 X
4,555,777 11/1985 Poteet .................. 365/205

Primary Examiner—Stuart N. Hecker
Assistant Examiner—Alyssa H. Bowler
Attorney, Agent, or Firm—Arnold, White & Durkee

[57] ABSTRACT

A general purpose sense amplifier, suited for memory and level shifting applications, is provided. The present invention provides a high input impedence for less loading of bit line voltages, wherein operation is relatively insensitive to capacitive mismatches on input bit line pairs. Inherent in the high input impedance design is the built-in isolation between input and output circuitry. The present invention also provides a full rail to rail separation of the output bit line voltages without requiring additional pull-up or pull-down circuitry. The present invention also provides a single strobing input for activating and deactivating the sense amplifier. The present invention also provides minimal circuitry with high speed characteristics and low power dissipation.

14 Claims, 3 Drawing Sheets

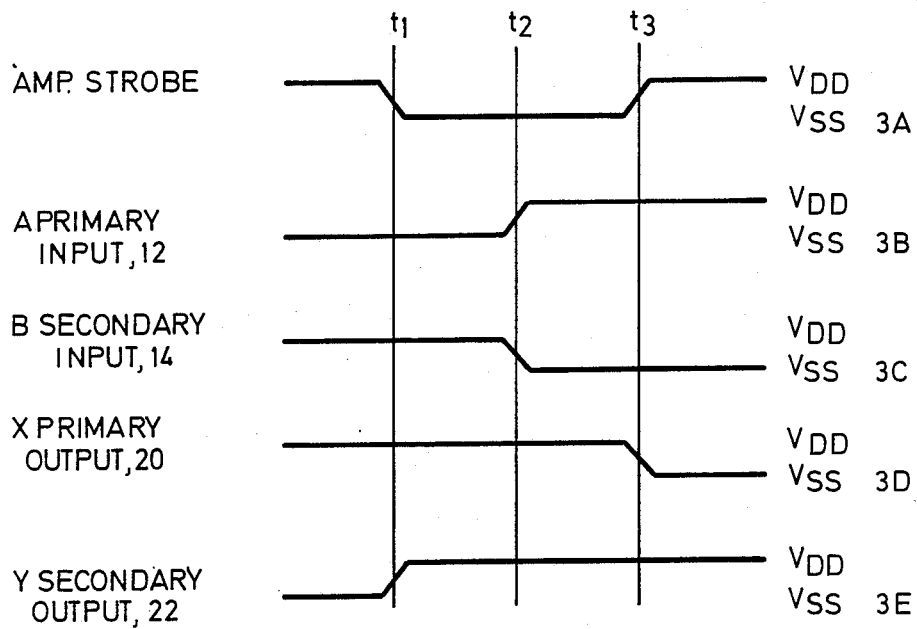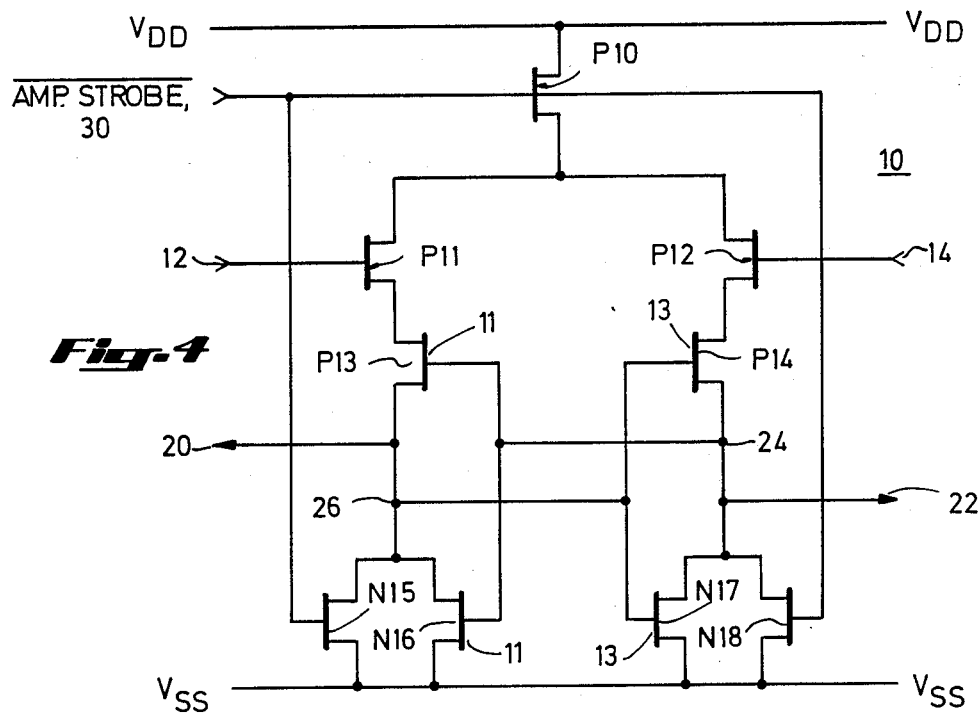

HIGH INPUT IMPEDANCE, STROBED CMOS DIFFERENTIAL SENSE AMPLIFIER

FIELD OF THE INVENTION

The invention relates in general to differential voltage amplifiers and more particularly to a CMOS strobed sense amplifier circuit used to amplify small or large differences in voltages to valid logic levels.

BACKGROUND OF THE INVENTION

Sense amplifiers are often used in memory circuit applications wherein relatively small voltage differences between bit lines are sensed to determine the data states of memory cells. While conventional sense amplifiers have been capable of sensing small voltage differentials, most have been unable to sense bit line input voltages without the use of additional input isolation devices. The low input impedance in a typical sense amplifier requires greater loading being applied to the sampled bit lines. Furthermore, most sense amplifiers cannot amplify a bit line voltage differential to a substantial full-rail (Vdd or Vss) voltage level.

SUMMARY OF THE INVENTION

A principal feature of the present invention is the provision of high input impedance for less loading of bit line voltages, wherein circuit operation is relatively insensitive to capacitive mismatches on input bit line pairs. Inherent in the high input impedance design is the built-in isolation between input and output circuitry. Another feature of the present invention is the provision of a full rail-to-rail separation of the output bit line voltages without requiring additional pull-up or pull-down circuitry. A further feature is the provision of a single strobing input for activating and deactivating the sense amplifier. A still further feature is the provision of minimal circuitry with high speed characteristics and low power dissipation.

In accordance with one embodiment, a sense amplifier utilizes primary and secondary pairs of devices. The primary pair of devices has a common gate input connected to a sense node on the secondary pair of devices. The secondary pair of devices also has a common gate input connected to a sense node on the primary pair of devices. Each P-channel transistor of the primary or secondary pair of devices is coupled to the respective N-channel of the primary or secondary pair of devices by a primary or secondary input transistor. Differential input voltages on the primary and secondary input transistor gates correspond to differential voltages on the input bit line pair. Since the input voltages feed MOS gates, input signal induced latch-up is virtually nonexistent. As used herein, latch-up refers to the forward biasing of diffused source or drain P/N junctions inherent in CMOS fabrication wherein a parasitic Silicon Controlled Rectifier (SCR) is caused to fire, interfering with normal circuit operation. In the present invention, since inputs feed gates and not sources or drains, the input voltages can exceed normal Vdd/Vss voltage supply rails with no harm to circuit operation.

Differential sensing operation does not commence until the sense amplifier is activated by a single strobing input. In addition to being able to enable or disable the sense amplifier circuit, the strobing input can also simultaneously enable or disable output pre-charge circuitry. The output precharge has the effect of balancing the sense nodes, prior to sensing. Simultaneous enable and precharge clocking by a single strobing input maximizes sensing and latching speeds while minimizing current spikes through the primary and secondary pairs of devices.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, when read in conjunction with the accompanying drawings; wherein:

FIG. 3A-3E illustrates timing diagrams and voltage levels on various input and output nodes of the present invention;

FIG. 4 illustrates an alternative embodiment of the present invention.

DETAILED DESCRIPTION OF PREFERRED EMBODIMENTS

Figure 2B:
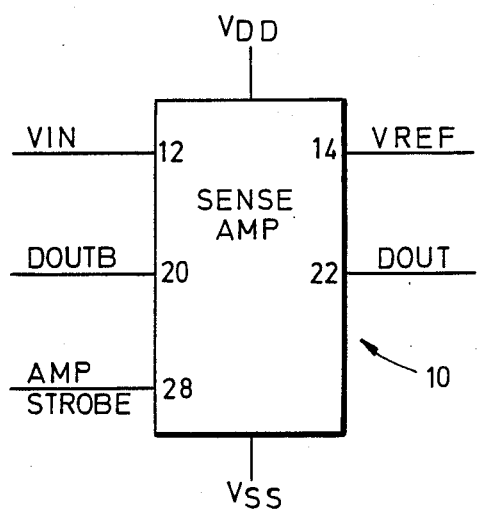
FIG. 2B illustrates a block diagram of a CMOS differential sense amplifier connected in a level-shifting configuration.
Figure 2A:
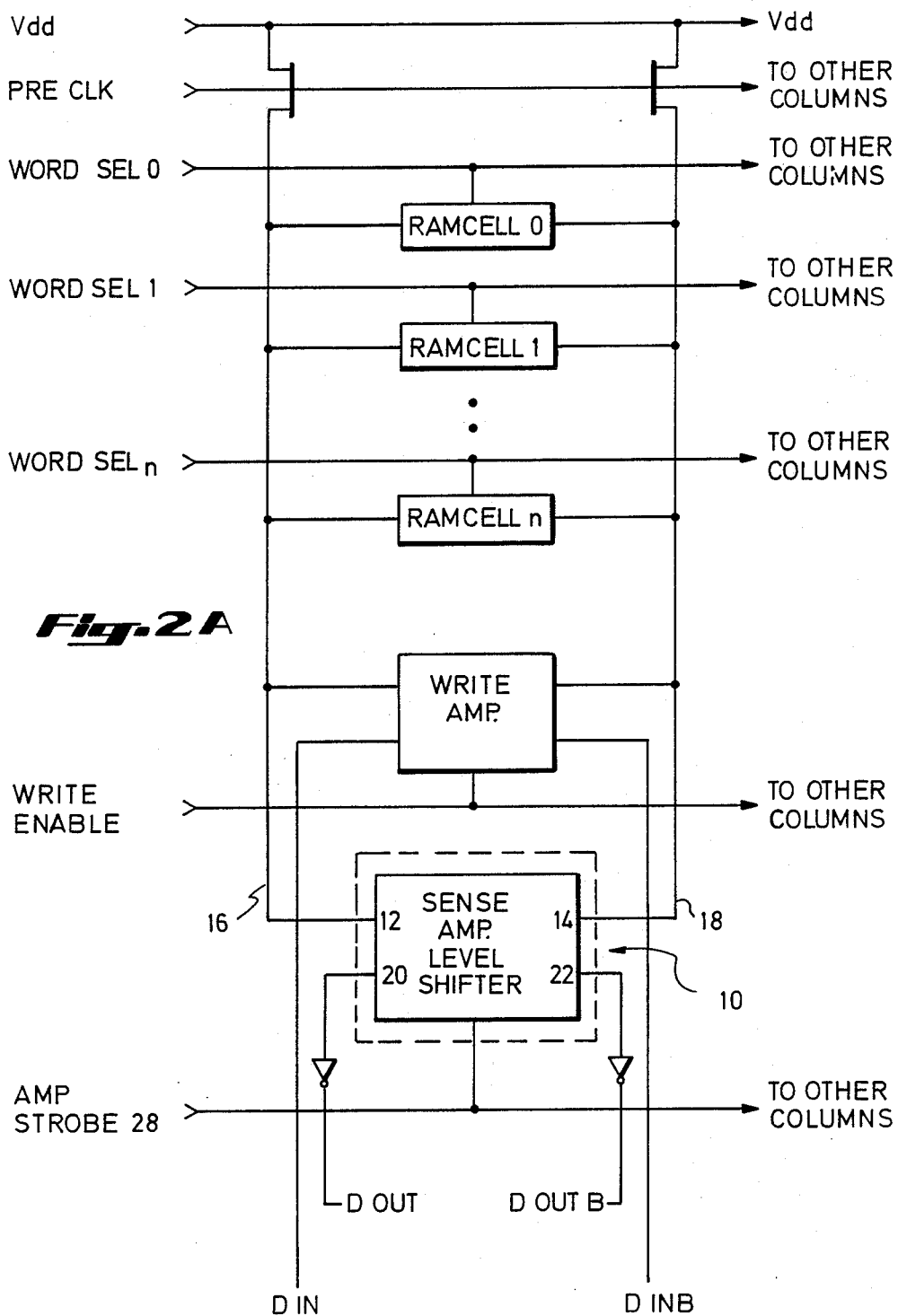
FIG. 2A illustrates a block diagram of a CMOS differential sense amplifier interconnected with a memory cell array.

Referring initially to FIG. 2A for background, a sense amplifier circuit 10 is illustrated in a typical RAM application. The sense amplifier has both a primary input line 12 and secondary input line 14, each input line respectively coupled to a pair of bit lines 16 and 18. Voltages on the bit line 16 and the bit line 18 are received on the input lines 12 and 14. During a read or sense operation, the differential voltage between the primary input line 12 and the secondary input line 14 is amplified such that the amplified differential input voltage appears on the primary output line 20 and the secondary output line 22. The amplified output will reflect the differential input voltages, however, the signals on the primary and secondary output lines 20,22, will remain isolated from the signals on the primary and secondary input lines 12, 14.

The output voltages on the primary output line 20 and the secondary output line 22 represent full-rail signals (Vdd or Vss) even though the input voltages on primary 12 and secondary input line 14 may not be at full-rail levels. By digitally processing the input line differentials, the voltages on the primary output line 20 and secondary output line 22 is amplified and fixed at a Vdd or Vss level. Because of the ease by which the differential input line voltages can be processed and transmitted to full-rail output voltages, the present invention sense amplifier is perfectly suited for either general purpose memory or level-shift applications.

Referring now to FIG. 2B, in a level shift application, one of the input lines, either the primary input line 12 or the secondary input line 14, can be level shifted. If the primary input line 12 is chosen as the level-shifted line, then the other input line, secondary input line 14, is generally placed at a reference voltage level, Vref. In a TTL to CMOS level shifting application, Vref might be chosen as 1.5 volts to maximize noise margin on the primary input line 12 and the secondary input line 14. When the primary input line 12 is configured for level shifting, corresponding primary output line 20 transitions to Vss or Vdd depending upon whether the primary input line 12 is greater or less than Vref on secondary input line 14. If the primary input line 12 is greater than Vref then primary output line 20 transitions to Vss. Conversely, when primary input line 12 is less than Vref, then primary output line 20 transitions to Vdd. In TTL to CMOS level shifting application, Vdd might be five volts and Vss might be zero volts. The entire level shifting circuit is activated when a high level amp strobe input is placed on the line 28. Assuming minimal leakage, the level-shifted value is retained on the chosen output line (either primary or secondary output line 20, 22) as long as the amp strobe signal on the line 28 remains activated.

Figure 1:
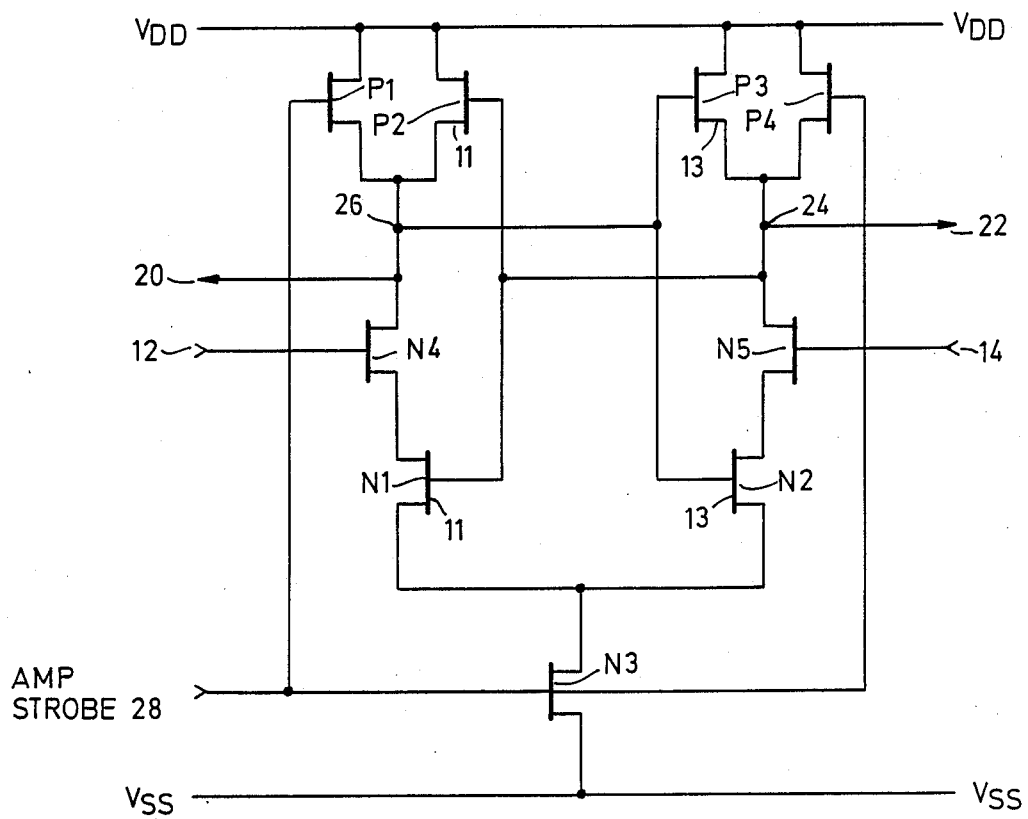
FIG. 1 illustrates a circuit diagram of a CMOS differential sense amplifier in accordance with the present invention.

In the following description of the present invention, elements common to the above circuit are commonly numbered. Referring now to FIG. 1, one embodiment of the invention is described in detail. A CMOS sense amplifier circuit 10 provides a primary pair of devices 11 with a common gate input, and a secondary pair of devices 13 with a common gate input. The primary pair of devices 11 has both a P-channel transistor P2 and an N-channel transistor N1 coupled in series by an N-channel primary input transistor N4. Each transistor has a source-to-drain path and a controlling gate. The gate of the primary input transistor N4 is connected to a primary input line 12. The gates of transistors P2 and N1 of the primary pair of devices 11 are connected to a secondary sense output node 24 of the secondary pair of devices 13. Also connected to the secondary sense output node 24 is a secondary output line 22. Therefore, the voltage on the secondary sense output node 24 controls the input gates on the primary pair of devices 11. To achieve a latching or cross-coupling configuration, the secondary pair of devices 13 must contain a similar internal transistor arrangement connected in the same manner as the primary pair of devices 11. The secondary pair of devices 13 provides a P-channel transistor P3 coupled in series to an N-channel transistor N2 by an N-channel secondary input transistor N5. The gate of the secondary input transistor N5 is connected to the secondary input line 14. The gates of the transistors P3 and N2 are connected to a primary sense output node 26 to which the primary output line 20 is connected.

The primary and secondary pairs of devices thus defines a common latching circuit whereby the input of the primary pair of devices 11 is connected to the secondary sense output node 24, and the input of the secondary pair of devices 13 is connected to the primary sense output node 26. The input of the primary pair of devices 11 is upon the gates of the transistors P2 and N1, and the input of the secondary pair of devices 13 is upon the gates of the transistors P3 and N2. By cross-coupling the primary and secondary pairs of devices, a differential input on the primary input line 12 and secondary input line 1 can be latched, and output voltages generated on the output lines 20, 22.

Before the input voltage differentials can be sensed and subsequently latched, the cross-coupled primary and secondary pairs of devices must be coupled to the supply voltages Vdd and Vss. The coupling transistors shown in FIG. 1 consist of two P-channel transistors P1 and P4, and an N-channel transistor N3. The transistor P1 is connected in parallel with the transistor P2 of the primary pair of devices 11, and the transistor P4 is connected in parallel with the transistor P3 of the secondary pair of devices 13. Also, the N-channel transistor N3 is connected in series between both primary and secondary pairs of devices and Vss. The gates of all three of the coupling transistors P1, P4, and N3 are connected together and are strobed by an amp strobe signal on the line 28.

The purpose of the single-strobed coupling transistors P1, P4, and N3 is to deactivate the cross-coupled primary and secondary latching pairs of devices 11, 13 during non-sensing or non-level shifting operations. A "low" level signal of the amp strobe signal on the line 28 will deactivate or electrically isolate the latching pairs of devices, whereas a "high" level strobe signal on the line 28 will activate the latching pairs of devices. A high level strobe signal on the line 28 generally corresponds to a voltage which exceeds Vdd — voltage threshold (Vth) of the P-channel transistors P1 or P4. A low level signal corresponds to a voltage level less than Vth on the N-channel transistor N3, assuming Vss is at 0 volts. When a high level strobe input is on the line 28 which activates the coupling transistor N3, the coupling transistors P1 and P4 are then simultaneously disabled making the cross-coupled pairs of devices 11, 13 appear as a simple latching circuit with a pair of input lines 12, 14 and a corresponding pair of output lines 20, 22.

Another important feature of the transistor input and latching configuration of the present invention is its broad sensing range. When the amp strobe signal on the line 28 goes high, the input line voltages on the primary input line 12 and the secondary input line 14 can be sensed or read. During the normal sensing operation, the latching pairs of devices 11, 13 function as a pure comparative circuit whereby the voltages on the primary and secondary output lines 20, 22 are isolated from the voltages on the primary and secondary input lines 12, 14. The output voltages represent only the comparative input voltage between the primary and secondary input lines 12, 14. The input voltages can be quite small (greater than Vth of N-Channel devices) or even greater than Vdd, yet still the comparative circuit will operate acceptably. The sense amplifier 10 compares only the input signals on the primary and secondary input lines 12, 14 with regard only to the difference in absolute magnitudes between the input signals. Thus, the sense amplifier 10 can easily read and compare input signals of differing magnitudes ranging anywhere between a level slightly above Vss (greater than Vth of N-Channel devices) to a level exceeding Vdd.

The coupling transistors P1, P4, and N3 serve two functions. The first is a way to completely eliminate drain current and power dissipation in the primary and secondary pairs of devices 11, 13 when the sense amplifier 10 is in a non-sensing or non-read/write mode. During non-sensing operating, both the primary and secondary output lines 20, 22 are pulled to Vdd, and no Vdd-to-Vss path or drain currents exist through the primary and secondary pairs of devices 11, 13. Besides saving power during non-sensing operation, a further advantage of the coupling transistor configuration is to balance the primary and secondary output lines 20, 22 in readiness for subsequent sensing operation. The second function of the coupling transistors is to electrically isolate the voltage signals on primary and secondary input lines 12, 14 from the primary and secondary output lines 20, 22. During sensing operation, only the differential input voltages on the primary and secondary input lines are amplified such that they appear on the primary and secondary output lines 20, 22. Provided the absolute magnitude of the voltages on both input lines is between Vth of the N-channel devices and a level exceeding Vdd, the output voltages on the primary and secondary output lines 20, 22 are fixed at full-rail levels reflecting only the differential voltages on the primary and secondary input lines 12, 14, after sensing has occurred.

Referring now to the timing diagram of FIG. 3, and more particularly FIG. 3A, a sensing or read/write period prior to time T1 corresponds to a high or Vdd level of the amp strobe on the line 28. During the sense period prior to time T1, the voltage on secondary input line 14 illustrated in FIG. 3C is shown to exceed the voltage on primary input line 12 illustrated in FIG. 3B. Since the voltage on secondary input line 14 exceeds the voltage on primary input line 12 prior to time T1, the voltage on primary output line 20 will latch at Vdd, and the voltage on secondary output line 22 will latch to Vss as illustrated by FIGS. 3D and 3E. At time T1, the amp strobe signal on the line 28 transitions to a low or Vss level, thereby disabling the transistor N3 and enabling both the P1 and P4 coupling transistors. The enabled P1 and P4 transistors provide direct coupling of both the primary and secondary output lines 20, 22 to Vdd as illustrated in FIGS. 3D and 3E. When the transistor N3 is disabled, and the primary and secondary output lines 20, 22 are drawn to Vdd, the primary and secondary input lines 12, 14 can transition at time T2 without affecting the pre-existing Vdd level on both the primary and secondary output lines 20, 22. At a later time T3, the amp strobe signal on the line 28 again transitions to a high sensing state, thereby enabling the transistor N3 and disabling both P1 and P4 coupling transistors. The conductive path formed by enabling the N3 transistor will activate the cross-coupled pairs of devices 11, 13 and consequently latch the primary and secondary output lines 20, 22. Since the voltage on the primary input line 12 exceeds the voltage on the secondary input line 14 at time T3, the transistor N4 will form a conductive path forcing primary output node 26 to transition to Vss, while the transistor N5 will not form a conductive path, thereby allowing the secondary sense output node 24 to remain at Vdd.

Referring now to FIG. 4, an alternate embodiment is illustrated whereby the cross-coupled pairs of devices 11, 13 are coupled to Vdd and Vss by one P-channel coupling transistor P10 and two N-channel coupling transistors N15 and N18. The primary pair of devices 11, having transistors P13 and N16, is coupled in series to the conductive path of the coupling transistor P10 by a P-channel primary input transistor P11. The secondary pair of devices 13, having transistors P14 and N17, is coupled in series to the conductive path of the coupling transistor P10 by a P-channel secondary input transistor P12. The gate of the primary input transistor P11 is connected to the primary input line 12, and the gate of secondary input transistor P12 is connected to the secondary input line 14. The gates of both the transistors P13 and N16 of the primary pair of devices 11 are connected to the secondary source output node 24 and the secondary output line 22. The gates of both the transistors P14 and N17 of the secondary pair of devices are connected to the primary source output node 26 and the primary output line 20. The primary source output is coupled to Vss by the N-channel coupling transistor N15 connected in parallel with the transistor N16. The secondary source output is coupled to Vss by the N-channel coupling transistor N18 connected in parallel with the transistor N17. The gates of the coupling transistors N15, N18, and P10 are all connected to $\overline{amp\ strobe}$ 30.

Still referring to FIG. 4, the alternate embodiment uses P-channel rather than N-channel input transistors, one P-channel rather than two P-channel Vdd coupling transistors, and two N-channel rather than one N-channel Vss coupling transistors. While the sense amplifier 10 shown in FIG. 1 uses a somewhat different configuration, the alternate embodiment functions in substantially the same manner as the preferred embodiment of FIG. 1. One strobing signal still controls the coupling transistors which activate or deactivate the latching pairs of devices. The primary and secondary input lines 12, 14 still couple to MOS gates having high input impedence and matching turn-on (Vth) voltages. The main reason in using the alternate configuration is to allow a lower input voltage sensing range. In the alternative configuration, the voltages on the primary and secondary input lines 12, 14 can range between a level below Vss to a level less than Vdd − Vth of the P-channel transistors P11 or P12.

Although various embodiments of the present invention have been described in this preferred and alternative form with a certain degree of particularity, it is to be understood that the present disclosure has been made only by way of example. Modifications and numerous changes in details of construction may be made without departing from the spirit and the scope of the invention.

What is claimed is:

1. A sense amplifier for sensing and level shifting differential input voltages comprising:

first and second voltage potential lines for providing first and second supply voltage;

first and second sense nodes for providing differential output voltages;

first voltage node;

a pair of input lines for receiving said differential input voltages;

a first pair of N-channel transistors, each transistor having a gate and conductive path, whereby the gates of the first pair of N-channel transistors are connected to respective ones of said pair of input lines;

a cross coupled CMOS latch circuit including a second pair of N-channel transistors and a first pair of P-channel transistors, each transistor having a gate and conductive path, the conductive paths of the second pair of N-channel transistors coupled respectively between said first pair of N-channel transistors and said first voltage node, the conductive paths of the first pair of P-channel transistors coupled respectively between said first and second sense nodes and said second voltage potential line;

first coupling means enabled by a strobe signal for coupling or decoupling said first and second sense nodes to said second voltage potential, the first coupling means including a second pair of P-channel transistor, each transistor having a gate and conductive path, the conductive path of said second pair of P-channel transistors respectively coupled between said first and second sense nodes and the second voltage potential line;

second coupling means enabled by a strobe signal for coupling or decoupling said cross coupled CMOS latch circuit to said first voltage potential line, the second coupling means including an N-channel transistor having a gate and conductive path, the conductive path of said N-channel transistor coupled between said first voltage node and said first voltage potential line; and strobing means for strobing both the first coupling means and the second coupling means, wherein said strobing means is coupled to said first coupling means and to said second coupling means to strobe them simultaneously.

2. A CMOS sense amplifier circuit for sensing stored voltage differential between a first and second bit line, each bit line connected to a series of memory cells of a memory array, comprising:

first and second voltage potential lines for providing first and second supply voltages;

first and second sense nodes;

first voltage node;

a first input line connected to the first bit line for receiving input voltages from said first bit line;

a second input line connected to the second bit line for receiving voltages from said second bit line;

a first input transistor having a gate and a source-to-drain path, the gate of first input transistor connected to said first input line whereby input signals on the first input line controls the source-to-drain path of said first input transistor;

a second input transistor having a gate and a source-to-drain path, the gate of second input transistor connected to said second input line whereby input signals on the second input line controls the source-to-drain path of said second input transistor;

a first output line for carrying output voltages, said first output line connected to the first sense node on said sense amplifier;

a second output line for carrying output voltages, said second output line connected to the second sense node on said sense amplifier;

a primary CMOS pair of devices having a first upper transistor and a first lower transistor coupled in series by said first input transistor, each transistor having a gate and a source-to-drain path, the first upper transistor connected in series between said second voltage potential line and the first sense node, the first lower transistor connected in series between said first input transistor and the first voltage node;

a secondary CMOS pair of devices having a second upper transistor and a second lower transistor coupled in series by said second input transistor, each transistor having a gate and a source-to-drain path, the second upper transistor connected between said second voltage potential line and the second sense node, the second lower transistor connected in series between said second input transistor and the first voltage node;

the gate of said first upper transistor connected to both the gate of said first lower transistor and said second sense node;

the gate of said second upper transistor connected to both the gate of said second lower transistor and said first sense node;

second coupling means for coupling or decoupling said first voltage node to said first voltage potential line, said second coupling means including a first coupling transistor having a gate and a source-to-drain path, the first coupling transistor is an N-channel transistor connected in series between both the first and second lower transistors and said first voltage potential line;

first coupling means for coupling or decoupling said first and second sense nodes to said second voltage potential line, said second coupling means comprising a second coupling transistor and a third coupling transistor, each second and third coupling transistor is a P-channel device having a gate and a source-to-drain path, the second coupling transistor is connected in parallel with the first upper transistor and the third coupling transistor connected in parallel with the second upper transistor, the gates of both the second and third coupling transistors are connected to the gate of said first coupling transistor;

strobing means for simultaneously strobing the gates of said first coupling transistor, said second coupling transistor, and said third coupling transistor.

3. The sense amplifier according to claim 2, wherein said first and second input transistor devices are N-channel field effect transistors.

4. The sense amplifier according to claim 3, wherein the channel width, channel length, input impedance, and threshold voltages of the first and second input transistor devices are substantially similar.

5. The strobing means according to claim 2, wherein the strobing input signals are generated external to the sense amplifier circuit.

6. The sense amplifier according to claim 2, wherein said first and second upper transistor devices are P-channel field effect transistors, and said first and second lower transistor devices are N-channel field effect transistor.

7. The sense amplifier according to claim 6, wherein the channel width, channel length, and threshold voltages of the first and second upper transistor devices are substantially similar, and the channel width, channel length, and threshold voltages of the first and second lower transistor are substantially similar.

8. A CMOS sense amplifier circuit for sensing stored voltage differentials between a first and second bit line, each bit line connected to a series of memory cells of a memory array, comprising:

first and second voltage potential lines for providing first and second supply voltages;

first and second sense nodes;

a first input line connected to the first bit line for receiving input voltages from said first bit line;

a second input line connected to the second bit line for receiving voltages from said second bit line;

a first input transistor having a gate and a source-to-drain path, the gate of first input transistor connected to said first input line whereby input signals on the first input line controls the source-to-drain path of said first input transistor;

a second input transistor having a gate and a source-to-drain path, the gate of second input transistor connected to said second input line whereby input signals on the second input line controls the source-to-drain path of said second input transistor;

a first output line for carrying output voltages, said first output line connected to the first sense node on said sense amplifier;

a second output line for carrying output voltages, said second output line connected to the second sense node on said sense amplifier;

a primary CMOS pair of devices having a first upper transistor and a first lower transistor connected in series, each transistor having a gate and a source-to-drain path, the first upper transistor connected in series between the first input transistor and said first lower transistor, the first lower transistor connected in series between the first upper transistor and said first voltage potential line, said first sense node connected between the first upper and the first lower transistor and within the source-to-drain path of said first upper and said first lower transistors;

a secondary CMOS pair of devices having a second upper transistor and a second lower transistor connected in series, each transistor having a gate and a source-to-drain path, the second upper transistor connected in series between the first input transistor and said second lower transistor, the second lower transistor connected in series between the second upper transistor and said first voltage potential line, said second sense node connected between the second upper and the second lower transistor and within the source-to-drain path of said second upper and said second lower transistors;

the gate of said first upper transistor connected to both the gate of said first lower transistor and said second sense node;

the gate of said second upper transistor connected to both the gate of said second lower transistor and said first sense node;

second coupling means for coupling or decoupling said CMOS sense amplifier circuit to said second voltage potential line, said second coupling means including a first coupling transistor having a gate and a source-to-drain path, the first coupling transistor is a P-channel transistor connected in series between both the first and second upper transistors and said second voltage potential line;

first coupling means for coupling or decoupling said first and second sense nodes to said first voltage potential line, the first coupling means comprising a second coupling transistor and a third coupling transistor, each second and third coupling transistor is an N-channel device having a gate and a source-to-drain path, the second coupling transistor is connected in parallel with the first lower transistor and the third coupling transistor is connected in parallel with the second lower transistor, the gates of both the second and third coupling transistors are connected to the gate of said first coupling transistor;

strobing means for simultaneously strobing the gates of said first coupling transistor, said second coupling transistor, and said third coupling transistor.

9. The sense amplifier according to claim 8, wherein said first and second input transistor devices are P-channel field effect transistors.

10. The sense amplifier according to claim 9 wherein the channel width, channel length, input impedence, and threshold voltages of the first and second input transistor devices are substantially similar.

11. The strobing means according to claim 10, wherein the strobing voltages are generated external to the sense amplifier circuit.

12. The sense amplifier according to claim 11, wherein said first and second upper transistor devices are P-channel field effect transistors, and said first and second lower transistor devices are N-channel field effect transistor.

13. The sense amplifier according to claim 12, wherein the channel width, channel length, and threshold voltages of the first and second upper transistor devices are substantially similar, and the channel width, channel length, and threshold voltages of the first and second lower transistor are substantially similar.

14. A sense amplifier for sensing and level shifting differential input voltages comprising:

first and second voltage potential lines for providing first and second supply voltage;

first and second sense nodes for providing differential output voltages;

first voltage node;

a pair of input lines for receiving said differential input voltages;

a first pair of N-channel transistors, each transistor having a gate and conductive path, whereby the gates of the first pair of N-channel transistors are connected to respective ones of said pair of input lines;

a cross coupled CMOS latch circuit including a second pair of N-channel transistors and a first pair of P-channel transistors, each transistor having a gate and conductive path, the conductive paths of the second pair of N-channel transistors coupled respectively between said first pair of N-channel transistors and said first voltage node, the conductive paths of the first pair of P-channel transistors coupled respectively between said first and second sense nodes and said second voltage potential line;

first coupling means enabled by a strobe signal for coupling or decoupling said first and second sense nodes to said second voltage potential, the first coupling means including a second pair of P-channel transistor, each transistor having a gate and conductive path, the conductive path of said second pair of P-channel transistors respectively coupled between said first and second sense nodes and the second voltage potential line;

second coupling means enabled by a strobe signal for coupling or decoupling said cross coupled CMOS latch circuit to said first voltage potential line, the second coupling means including an N-channel transistor having a gate and conductive path, the conductive path of said N-channel transistor coupled between said first voltage node and said first voltage potential line; and strobing means for strobing both the first coupling means and the second coupling means, wherein said strobing means includes a clocking input line coupled to both the gate of the N-channel transistor of said second coupling means and to the gates of the second pair of P-channel transistors of said first coupling means, such that said second coupling means and said first coupling means are clocked simultaneously, whereby the second coupling means is respectively enabled/disabled when the first coupling means is disabled enabled.

* * * * *

UNITED STATES PATENT AND TRADEMARK OFFICE
CERTIFICATE OF CORRECTION

PATENT NO. : 4,910,713
DATED : March 20, 1990
INVENTOR(S) : Madden et al.

It is certified that error appears in the above-identified patent and that said Letters Patent is hereby corrected as shown below:

Title page item [73]; change "Digital Euipment Corporation," to --Digital Equipment Corporation,--.

On page 1, number [56]; insert the following references,

| | | | |
|---|---|---|---|
| --4,247,791 | 1/1981 | Rovell | 307/355 |
| 4,717,838 | 1/1988 | Brehmer et al. | 307/355 |
| 3,676,702 | 7/1972 | McGrogan, Jr. | 307/235 |
| 4,598,215 | 7/1986 | Schechtman et al. | 307/355 |
| 4,716,320 | 12/1987 | McAdams | 307/530 |
| 4,644,197 | 2/1987 | Flannagan | 307/530 |
| 4,567,389 | 1/1986 | Van Tran | 307/530 |
| 4,539,495 | 9/1985 | Demler | 307/530 |

"An Ultralow Power 8K x 8-Bit Full CMOS RAM with a Six-Transistor Cell", IEEE Journal of Solid-state Circuits, October, 1982.--

UNITED STATES PATENT AND TRADEMARK OFFICE
CERTIFICATE OF CORRECTION

PATENT NO. : 4,910,713

DATED : March 20, 1990

INVENTOR(S) : Madden et al.

It is certified that error appears in the above-identified patent and that said Letters Patent is hereby corrected as shown below:

In column 3, line 57; please replace "input line 1 can be latched" with --input line 14 can be latched--.

Signed and Sealed this

Fourteenth Day of August, 1990

Attest:

HARRY F. MANBECK, JR.

Attesting Officer

Commissioner of Patents and Trademarks